(12) United States Patent
Kang

(10) Patent No.: US 9,958,708 B1
(45) Date of Patent: May 1, 2018

(54) METHOD OF SHORT OPTICAL PULSE GENERATION

(71) Applicant: LGS INNOVATIONS LLC, Herndon, VA (US)

(72) Inventor: Inuk Kang, Holmdel, NJ (US)

(73) Assignee: LGS INNOVATIONS LLC, Herndon, VA (US)

(*) Notice: Subject to any disclaimer, the term of this patent is extended or adjusted under 35 U.S.C. 154(b) by 0 days. days.

(21) Appl. No.: 15/386,910

(22) Filed: Dec. 21, 2016

(51) Int. Cl.
*H04B 14/02* (2006.01)
*H04B 1/04* (2006.01)
*G01N 21/55* (2014.01)
*G02F 1/01* (2006.01)
*G01S 17/88* (2006.01)
*G02F 1/365* (2006.01)
*H01S 3/00* (2006.01)
*G02F 1/21* (2006.01)
*H04B 10/50* (2013.01)
*G02F 1/225* (2006.01)
*H04B 10/299* (2013.01)
*H04B 10/508* (2013.01)

(52) U.S. Cl.
CPC .......... *G02F 1/0121* (2013.01); *G01N 21/55* (2013.01); *G01S 17/88* (2013.01); *G02F 1/21* (2013.01); *G02F 1/365* (2013.01); *H01S 3/0057* (2013.01); *G02F 1/225* (2013.01); *G02F 2001/212* (2013.01); *G02F 2203/26* (2013.01); *H04B 10/299* (2013.01); *H04B 10/505* (2013.01); *H04B 10/508* (2013.01); *H04B 10/5051* (2013.01); *H04B 10/50575* (2013.01)

(58) Field of Classification Search
CPC .. H04B 10/508; H04B 10/299; H04B 10/505; H04B 10/5051; H04B 10/50575; G02F 1/225; G02F 1/0121; G02F 1/21; G02F 1/365; G01N 21/55; G01S 17/88; H01S 3/0057
See application file for complete search history.

(56) References Cited

U.S. PATENT DOCUMENTS

| | | | |
|---|---|---|---|
| 6,778,310 B2 * | 8/2004 | Puleo | H04B 10/50575 359/239 |
| 7,133,622 B2 | 11/2006 | Winzer | |
| 7,483,635 B2 | 1/2009 | Xu | |
| 2005/0078350 A1 | 4/2005 | Prucnal et al. | |
| 2009/0060107 A1* | 3/2009 | Fischer | H04L 7/046 375/355 |

* cited by examiner

*Primary Examiner* — Jennifer Wecker
(74) *Attorney, Agent, or Firm* — Baker & Hostetler LLP

(57) ABSTRACT

The present application is directed to a method of short pulse generation. The method includes the step of creating, via electrical circuitry in a master oscillator, a square wave pulse with a predetermined pulse repetition rate. The method includes the step of retiming the square pulse with a clock. The method includes the step of recovering an electrical signal from the retimed square pulse. Further, the method includes the step of sending the recovered electrical signal to a modulator for modulating an optical signal.

20 Claims, 5 Drawing Sheets

METHOD OF SHORT OPTICAL PULSE GENERATION

FIELD

This application is directed to a method and apparatus for generating picosecond optical pulses.

BACKGROUND

Optical pulses are flashes of light that are typically generated with lasers and delivered in the form of laser beams. Short optical pulses, whose duration ranges from picoseconds (ps) to nanoseconds (ns), are employed for optical communication and sensing applications such as LIDAR (Light Detection And Ranging) and spectroscopy. Benefits of shorter optical pulses include improved target resolution in LIDAR and increased data transfer rates in optical communication.

Optical pulses can be generated using a pulse carver. The pulse carver modulates an incoming laser beam to generate a train of short optical pulses. Conventional pulse carvers include a single optical modulator and sinusoidal electrical drive limited to generating high duty cycle (i.e., >30%) pulse trains. Here, the generated optical pulse duration is fixed and inversely proportional to the repetition rate. For example, while pulses less than 10 ps can be generated at a pulse repetition rate of ~40 GHz, ~100 ps pulses can be generated at a repetition rate of ~4 GHz.

Longer measurement ranges can be attained with lower repetition rates (~MHz) in LIDAR sources. However, these LIDAR sources rely on complex, high-speed analog electronics drive optical modulators to generate and amplify short-duration electrical pulses.

Analog electronic signal processing circuits processing return-to-zero (RZ) electrical pulses require much higher bandwidth and complexity than electronics processing digital or non-return-to-zero (NRZ) signals. However, achieving distortion-free amplification of electrical RZ pulses with more than ~30 GHz bandwidth and/or pulse durations less than ~10 ps is difficult. Analog electronic pulse generation also is susceptible to temporal jitter.

What is therefore desired in the art is a method and architecture for producing optical pulses less than about 10 ps employing flexible pulse repetition rates. What is also desired in the art is architecture for producing short optical pulses employing digital electronics to reduce complexity and power consumption.

SUMMARY

The foregoing needs are met, to a great extent, by the application directed to a short optical pulse generation using an optical modulator driven by NRZ electronic signals.

One embodiment of the application is directed a method of short pulse generation. The method includes the step of creating, via electrical circuitry in a master oscillator, a square wave pulse with a predetermined pulse repetition rate. The method includes the step of retiming the square pulse with a clock. The method includes the step of recovering an electrical signal from the retimed square pulse. Further, the method includes the step of sending the recovered electrical signal to a modulator for modulating an optical signal.

Another embodiment of the application is directed a system for generating optical pulses. The system includes a modulator for modulating a signal received from a continuous wave. The system also includes a drive generator that drives the modulator with an electrical signal for modulating the continuous wave. The drive generator includes circuitry configured to (i) create a square wave pulse with a predetermined pulse repetition rate, (ii) retime the square pulse with a clock, and (iii) recover the electrical signal from the retimed square pulse.

Yet another embodiment of the application is directed to a method for performing testing on a material. The method includes a step of providing the material having a chemical compound. The method also includes a step of providing a master oscillator. The master oscillator creates a square wave pulse via electrical circuitry. The master oscillator also retimes the square pulse with a clock. The master oscillator also recovers a signal from the retimed square pulse. The master oscillator even further sends the recovered signal to a modulator. Next, the method includes a step of sensing the chemical compound of the material using the master oscillator via LIDAR techniques.

There has thus been outlined, rather broadly, certain embodiments in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF THE DRAWINGS

In order to facilitate a fuller understanding of the invention, reference is now made to the accompanying drawings, in which like elements are referenced with like numerals. These drawings should not be construed as limiting the invention and intended only to be illustrative.

DETAILED DESCRIPTION

Figure 1:
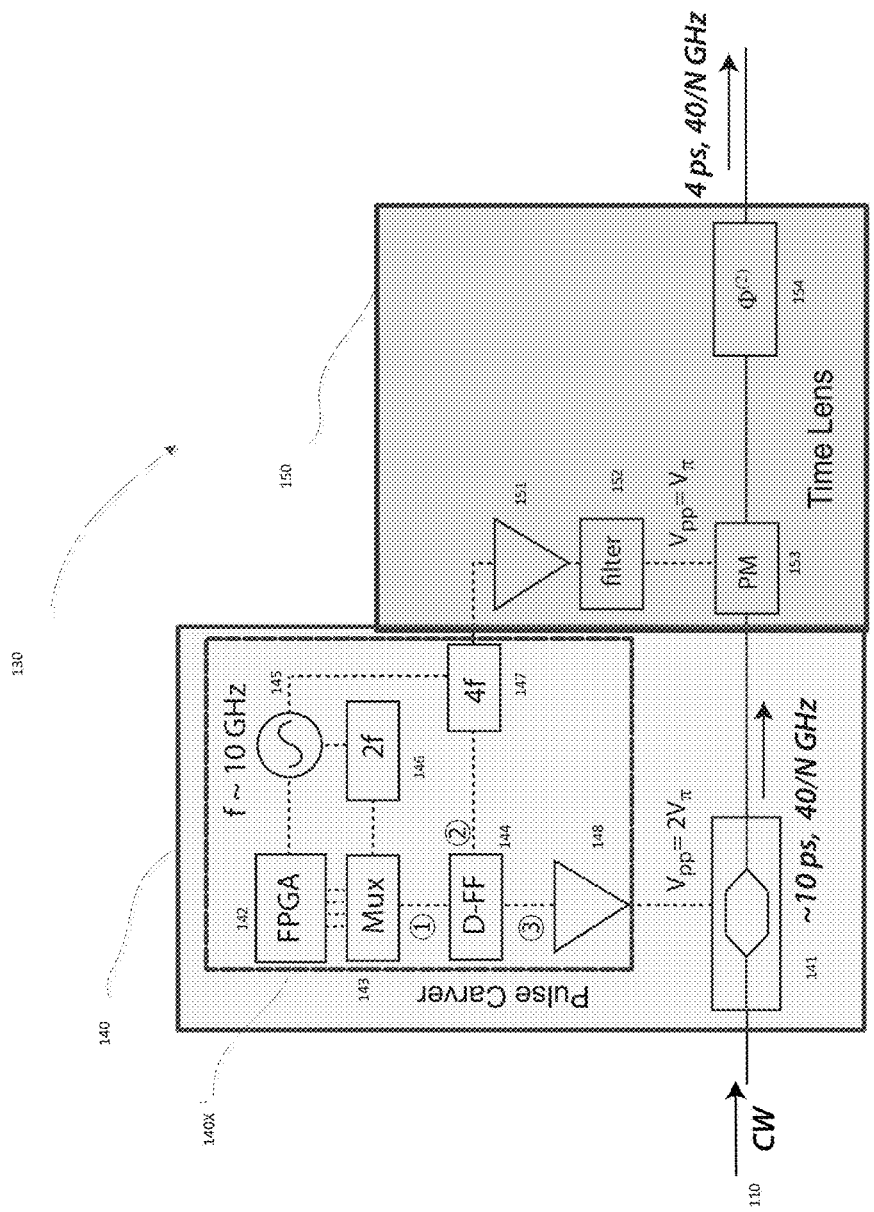
FIG. 1 illustrates a master oscillator according to an aspect of the application.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

Reference in this application to "one embodiment," "an embodiment," "one or more embodiments," or the like means that a particular feature, structure, or characteristic described in connection with the embodiment is included in at least one embodiment of the disclosure. The appearances of, for example, the phrases "an embodiment" in various places in the specification are not necessarily all referring to the same embodiment, nor are separate or alternative embodiments mutually exclusive of other embodiments. Moreover, various features are described which may be exhibited by some embodiments and not by the other. Similarly, various requirements are described which may be requirements for some embodiments but not by other embodiments.

While the methods and architectures described herein may be used in a variety of applications, they are considered particularly useful in the fields of optical communications and sensing. Specifically, pulsed optical sources capable of producing less than about 10 ps duration pulses are realized with variable repetition rates. This is a desired component in receiving Optical Time-Division Multiplexed (OTDM) signals for de-multiplexing signals of interest into tributaries having a lower clock speed. Additionally, such sources will benefit optical ranging and vibrometry, providing improved spatial resolution and range disambiguation.

According to an aspect of this application, a method is described for generating short optical pulses having a pulse duration less than 10 ps. In addition, the short optical pulses exhibit a duty cycle that can be electronically varied over a wide range. In an embodiment, the architecture employed to obtain these such short optical pulses exhibits low size, weight and power (SWaP) characteristics benefitting from the use of digital (i.e., NRZ) signals to generate short optical pulses instead of relying on RZ electrical pulses for carving optical pulses. Specifically in RZ signaling, the signal drops (i.e., returns) to zero between each pulse. RZ signals suffer drawbacks in which twice the bandwidth is necessary to achieve the same data-rate as the NRZ format. Conversely, NRZ signal is binary. As a result, 1s are represented by a positive voltage and 0s are represented by a negative voltage. There is no neutral or rest condition.

As shown in FIG. 1, light from a continuous wave (CW) signal 110 is passed through a pulse carver 120 of a master oscillator 130. Alternatively, plural CW distributed feedback (DFB) lasers may be employed where each laser beam is tuned to a different frequency generating slightly different wavelengths from one another. The multiple beams may be sent to a multiplexer 115 (not shown) which combines the plural beams. The multiplexed beam may be directed to a master oscillator 130.

The master oscillator 130 includes a pulse carver 140. The master oscillator 130 is driven by an electrical signal generated by an electrical signal processing unit 140X as shown by the encircled hardware in the pulse carver in FIG. 1. The outputs from the lasers 110 may be combined in a wavelength division multiplexer (WDM) 115 (not shown) to form a multiplexed beam. The beam may be converted to a desired pulse by a Mach-Zehnder modulator (MZM) 141. The electro-optic bandwidth of the MZM may limit the narrowest pulse duration which may be generated from the MZM. For example, ~10 ps or longer pulse generation is possible using a MZM having about a 30 GHz electro-optic bandwidth.

The MZM may be constructed using electro-optic materials such as lithium niobate ($LiNbO_3$), gallium arsenide (GaAs), or indium phosphide (InP). The MZM consists of an interferometric optical waveguide structure and electrodes. Electrical voltages applied to the electrodes will induce optical phase shifts owing to the electro-optic effect. The electrical voltage required to induce π phase shift is called $V_\pi$.

An implementation of the signal processing unit 140X may include a field programmable gate array (FPGA) 142, multiplexer (Mux) 143, D flip-flop (D-FF) 144, radio-frequency (RF) clock 145, clock frequency doubler 146, clock frequency quadrupler 147 and an amplifier 148.

The FPGA 142 is an integrated circuit designed to be configured by a customer or a designer after manufacturing. An FPGA 142 includes an array of programmable logic blocks and a hierarchy of interconnects that allow blocks to be wired together. Generally, the FPGA architecture includes an array of logic blocks (i.e., configurable logic block, CLB, or logic array block, LAB), I/O pads, and routing channels. Generally, all the routing channels have the same width (number of wires). Multiple I/O pads may fit into the height of one row or the width of one column in the array.

An application circuit may be mapped into an FPGA with adequate resources. While the number of required CLBs/LABs and I/Os may be determined from the design, the number of routing tracks may be variable. Most of the circuitry built inside of an FPGA is synchronous circuitry that requires a clock signal. Such clock signal is derived from the RF clock 145, which also is used to generate clock signals for the mux 143 via the frequency doubler 146 and the D-FF 144 via the frequency quadrupler 147.

The pulse carver may also include clock recovery circuitry 149 (not shown) to generate a clock signal in lieu of the RF clock 145. The need for a clock recovery circuit may arise when the pulse carver is required to generate a train of short optical pulses that are synchronized to another optical signal of interest. For example, in optical sampling of a telecommunication signal, the repetition rate of the sampling pulses should be sub-harmonic of the data rate of the signal under test. Such clock recovery circuitry may contain an optical phase detector, phase-locked loop, and voltage-controlled oscillators as envisaged by one skilled in the art.

The electronic signal processing unit 140X may include a data multiplexer (Mux) 143. The Mux here aggregates the outputs of the FPGA (142) by time-division multiplexing so that the data rate and hence bandwidth of the FPGA output signals are increased by $2^n$. Since the rise time of the electronic signal is inversely proportional to the bandwidth, the rise time is decreased by $2^n$ in multiplexing. According to an embodiment of the application, four (i.e., n=2) 10 Gbit/s (rise time ~40 ps) output of the FPGA output channels are multiplexed to form a single NRZ drive signal having a rise time of ~10 ps. It is noted that Mux processing is regulated by the frequency-doubled output of the RF clock 145.

An amplifier (amp) 148 is an electronic device that can increase the amplitude of a signal. The amp 148 can either be a discrete piece of equipment or an electrical circuit contained within another device. According to an embodiment, it is important that the peak-to-peak voltage amplitude of the amplified NRZ signal is substantially identical to twice the $V_\pi$ of the MZM to produce short optical pulses having a high extinction ratio. In an alternate implementation, a MZM with dual input ports may be used wherein each input port should receive amplified NRZ signal with amplitude substantially identical to $V_\pi$.

Figure 2:
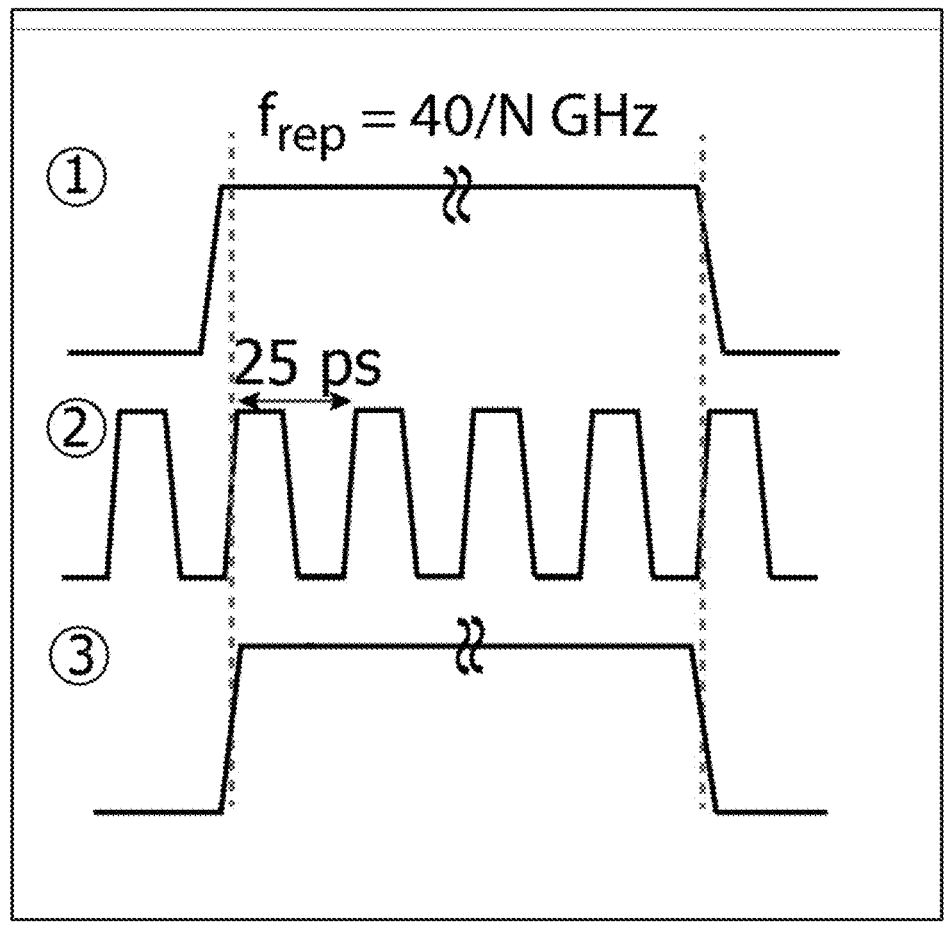
FIG. 2 illustrates a technique employed in a master oscillator for generating the digital drive signal with reduced temporal jitter according to an aspect of the application.

In another aspect of the application, a technique for producing an electrical signal via the signal processing unit in the pulse carver 140 is described. The intermediate signals are denoted by numbers encapsulated in a circle shown in FIG. 1 adjacent the D-FF 144. According to an exemplary embodiment as illustrated in FIG. 2, a square wave pulse (signal 1) is produced at the output of the Mux 143. The rise time of the pulse is determined by the bandwidth of the Mux.

In the case illustrated in FIG. 2, the rise time of the pulse is ~10 ps and limited by the data rate of the Mux (40 Gb/s). The repetition period of the pulse is an integer multiple of the Mux bit period (25 ps) and can be controlled by adjusting the output data pattern of the FPGA. The repetition rate of the electronic signal, and hence, the generated optical pulses can be controlled to be 40/N GHz, where N is an arbitrary positive integer. In applications for LIDAR, the required pulse repetition rate can be 1 MHz. To support such application, N should be 40,000. In application for optical sampling to demultiplex 80 Gb/s optical data into eight sub-channels with 10 Gb/s data rates each, the repetition rate of the pulse should be 10 GHz with N=4.

Next, the square pulse (signal 1) is retimed with a clock (signal 2) in the D Flip-Flop (D-FF) 144. The D-FF 144 is a device to align the transition of the NRZ signal to the rising edge of the reference clock. In the case illustrated in FIG. 2, the output data rate of the Mux is a sub-harmonic of 40 Gb/s and accordingly the reference clock to be used for retiming is 40 GHz (signal 2). However, other clock rates can be used depending on the speed of the Mux.

The retiming step is employed to reduce jitter that may be present in the Mux output. State-of-the-art D-FF 144 can reduce the jitter of the input signal (i.e., signal 1) to as low as ~200 fs at the output (i.e., signal 3), which is negligible in optical pulses having duration of ~10 ps.

Figure 3:
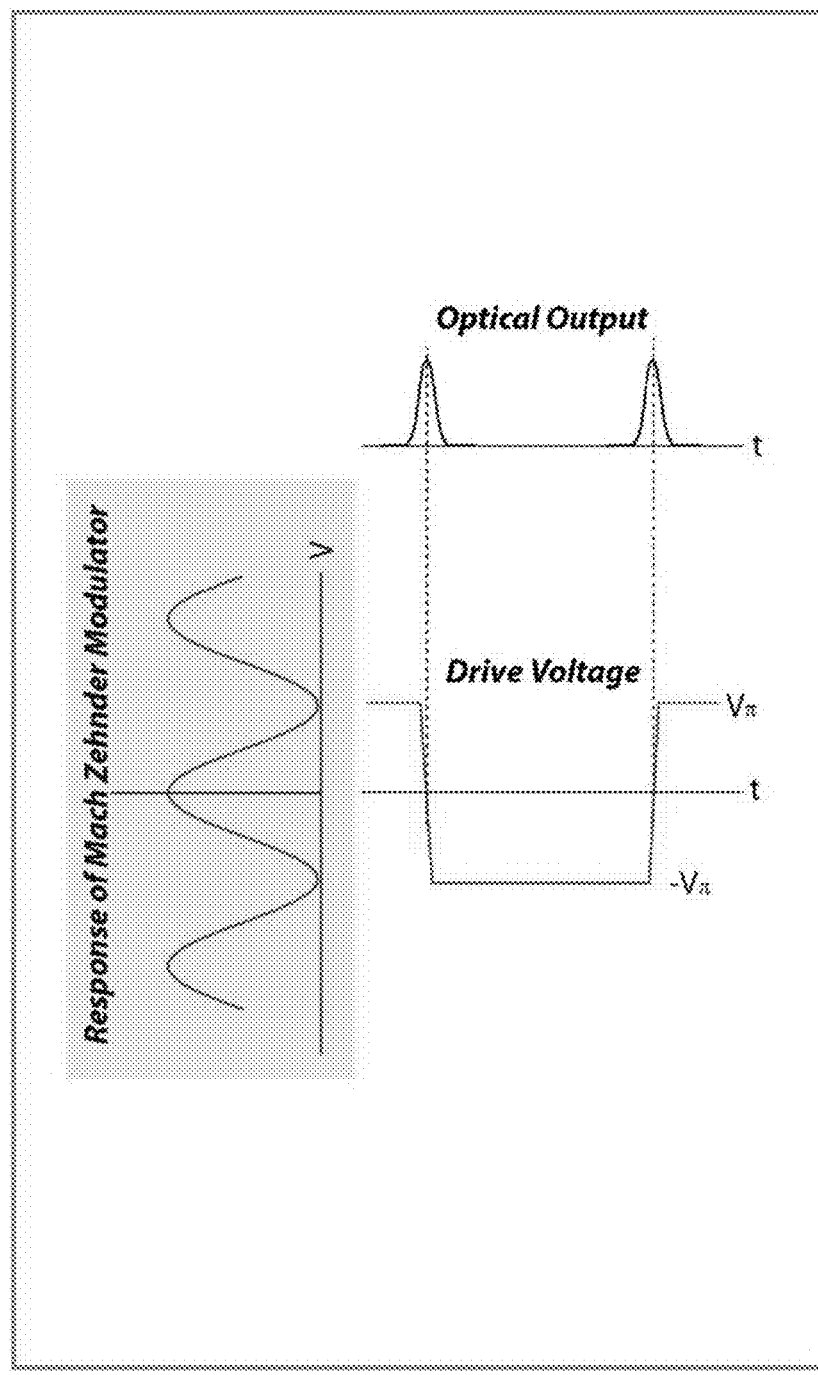
FIG. 3 illustrates an exemplary principle for generating short optical pulses by driving a Mach-Zehnder modulator in a pulse carver with a digital electrical signal having amplitude equal to $2V_\pi$ according to an aspect of the application.

According to an embodiment, the electrical signal may be sent to an amplifier 148 downstream from the D Flip-Flop. The electrical signal is then sent to the MZM 141 to drive it in order to modulate the received CW signal. In an embodiment, a single modulator is employed. FIG. 3 illustrates a typical response of a MZM 141 that may be employed. The drive voltage makes fast transitions between $-V_\pi$ and $V_\pi$.

Since the optical transmission can only occur when the voltage applied to the MZM is not an odd multiple $V_\pi$, short optical pulses can be generated during the transition periods using the drive signal shown in FIG. 3. Furthermore, the optical pulse duration is limited by the rise and fall time of the electronic signal. Using the electronics described in FIG. 2 having ~40 GHz bandwidth, pulse duration of 8-10 ps can be achieved.

According to an embodiment, while FIG. 2 and FIG. 3 imply a simple case wherein pulse-to-pulse separation is fixed, it may vary from pulse to pulse or may be changed by programming the FPGA which generates the NRZ pulse train. The electronic signal processing unit or drive generator 140X may be implemented using an Application-Specific Integrated Circuit (ASIC) instead of collection of discrete electronic components, including FPGA.

A multitude of MZMs that are driven with similar drive signals in FIG. 2 may be used in series to increase the extinction ratio of the generated optical pulses, as well as narrowing the pulse duration. For example, when N such MZMs are used in series, the resulting pulse duration is 1/$\sqrt{N}$ of the pulse duration that can be obtained using a single MZM.

If further reduction of pulse duration is desired, a time lens 150 as shown in FIG. 1 may be implemented. A time-lens 150 works by imposing a quadratic phase on an incoming E-field in time, followed by a device having quadratic chromatic dispersion $\Phi^{(2)}$. In FIG. 1, a 40 GHz clock (4f) 147, after amplification via an amplifier 151 and narrow-band filtering via a filter 152, may be advantageously used to apply temporal cosine modulation on the optical pulses as shown in FIG. 3.

Figure 4:
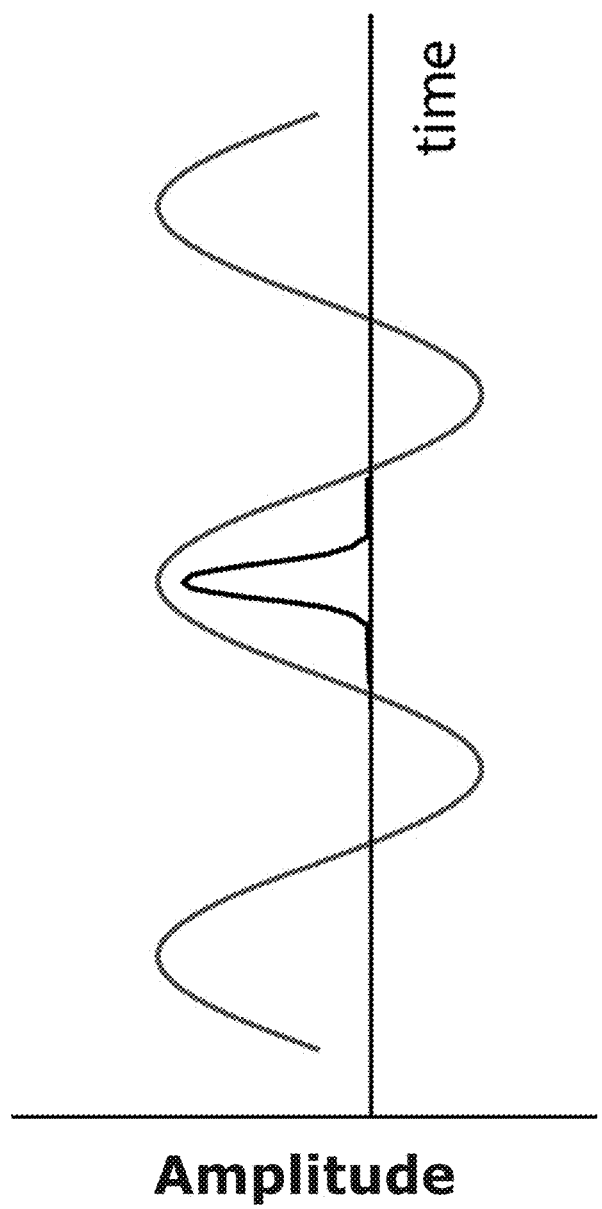
FIG. 4 illustrates a relative timing between the optical pulses and the phase modulation drive signal in a time lens used for pulse compression.

In FIG. 4, the electric field of the optical pulse is described as $$E(t) = E_0 \exp\left(-\frac{t^2}{2T_0^2}\right)$$

and phase modulation $\Delta\Phi = \pi V/(2V_\pi)\cos(2\pi f t)$, where $T_0$ is the pulse duration of the signal input to the phase modulator, f is the RF phase modulation frequency, and V is the amplitude of the voltage driving the phase modulator.

When $\Phi^{(2)}$ of the dispersive device 154 in FIG. 1 satisfies the condition $\Phi^{(2)} = KT_0^2/(1+K^2)$, the output of the dispersive duration is compressed to $T = T_0/\sqrt{1+K^2}$. Note that K is related to the pulse and phase modulation parameters as $K = (2\pi^3 V f^2 T_0^2/V_\pi)$. For example, if the phase modulation amplitude V is set to $V_\pi$ and the modulation frequency f is 40 GHz, then the input pulse duration of 10 ps can be compressed to 4 ps using the time lens.

Figure 5:
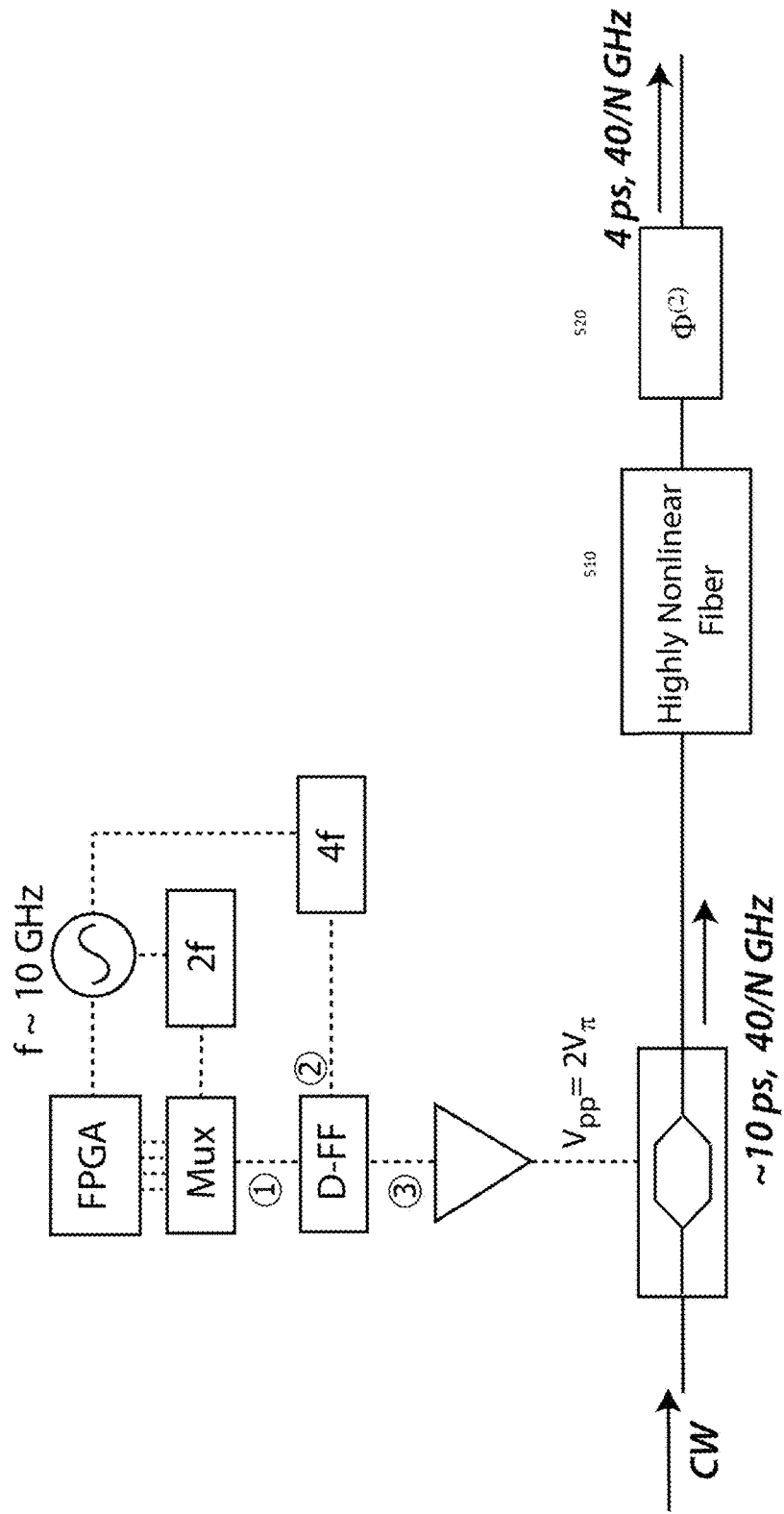
FIG. 5 illustrates a master oscillator using a highly nonlinear fiber for pulse compression according to another aspect of the application.

The dispersive device 154 may be implemented using fiber, chirped fiber grating, or other types of dispersion compensating devices commonly used in telecommunications. In an alternative embodiment, compression of the pulse duration of the pulse carver output may be achieved using a highly nonlinear fiber 510 as shown in FIG. 5. This may be followed by a linear dispersive device 520 similar to element 154 in FIG. 1. The Kerr optical nonlinearity of the highly nonlinear fiber, which is characterized by the non-linear optical coefficient γ, can induce optical bandwidth broadening requisite for generating shorter optical pulses. The magnitude of the spectral broadening depends on the peak power and duration of the pulse and the optical nonlinearity of the fiber. A linear dispersive device 520, such as a chirped fiber Bragg grating, can be used to compensate for the dispersion accumulated in the nonlinear fiber and compress the optical pulse duration. For example, a 10 ps pulse having 30 watts of peak power propagating in 10 m highly nonlinear fiber 510 with $\gamma = 10$ $W^{-1}km^{-1}$ can induce sufficient bandwidth broadening to be compressed to 4 ps.

Yet another aspect of the application is direct to a method for performing testing on a material comprising. The method includes a step of providing material having a chemical compound. The method also includes a master oscillator as described above in this application. The master oscillator is configured to perform the steps of creating a square wave pulse via electrical circuitry; retiming the square pulse with a clock; recovering a signal from the retimed square pulse, and sending the recovered signal to a modulator. The method also includes a step of sensing the chemical compound of the material using the master oscillator via LIDAR techniques.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

What is claimed is:

1. A method for generating an optical pulse comprising:
   creating, via electrical circuitry in a master oscillator, a square wave pulse with a predetermined pulse repetition rate;
   retiming the square pulse with a clock;
   recovering an electrical signal from the retimed square pulse; and sending the recovered electrical signal to a modulator for modulating an optical signal.

2. The method of claim 1, further comprising:
receiving a continuous wave signal at an input of the master oscillator; and
generating an optical pulse from the modulator that is less than about 10 picoseconds.

3. The method of claim 2, wherein the generated optical pulse is greater than about 8 picoseconds.

4. The method of claim 1, wherein the pulse repetition rate is less than 40 GHz.

5. The method of claim 1, wherein the electrical signal is directly recovered from the retimed square wave pulse.

6. The method of claim 1, wherein the square pulse is based upon a non-return-to-zero signal.

7. The method of claim 1, further comprising:
amplifying the recovered signal, wherein a peak-to-peak voltage amplitude of the recovered signal is equal to about twice the voltage potential '$V_\pi$' of the modulator.

8. A system for generating optical pulses comprising:
a modulator for modulating a signal received from a continuous wave; and
a drive generator that drives the modulator with an electrical signal for modulating the continuous wave, the drive generator including circuitry configured to:
create a square wave pulse with a predetermined pulse repetition rate,
retime the square pulse with a clock, and
recover the electrical signal from the retimed square pulse.

9. The system of claim 8, further comprising:
an amplifier downstream of the clock to amplify the electrical signal prior to reaching the modulator.

10. The system of claim 8, wherein
the modulator is located in a pulse carver, and
the pulse carver includes a single modulator.

11. The system of claim 8, wherein the modulated optical signal is less than about 10 ps.

12. The system of claim 11, wherein the modulated optical signal is greater than about 8 ps.

13. The system of claim 8, wherein the pulse repetition rate is less than about 40 GHz.

14. The system of claim 13, wherein the electrical signal is directly recovered from the retimed square wave pulse.

15. The system of claim 8, further comprising:
a time lens configured to compress the modulated optical signal by about half at a pulse repetition rate of about 40 GHz.

16. The system of claim 15, wherein the time lens includes a single pulse modulator.

17. The system of claim 15, wherein the modulated optical signal is transmitted to a nonlinear fiber upstream of a linear dispersive device in the time lens.

18. A method for performing testing on a material comprising:
providing the material having a chemical compound;
providing a master oscillator being configured to
create a square wave pulse via electrical circuitry,
retime the square pulse with a clock,
recover a signal from the retimed square pulse, and
sending the recovered signal to a modulator; and
sensing the chemical compound of the material using the master oscillator via LIDAR techniques.

19. The method of claim 18, further comprising:
generating an optical pulse from the modulator that is less than about 10 picoseconds,
wherein the square wave is generated with a pulse repetition rate that is less than about 40 GHz.

20. The method of claim 18, wherein the electrical signal is directly recovered from the retimed square wave pulse.

* * * * *